US010467092B2

(12) United States Patent
Vaidhyanathan et al.

(10) Patent No.: US 10,467,092 B2
(45) Date of Patent: Nov. 5, 2019

(54) PROVIDING SPACE-EFFICIENT STORAGE FOR DYNAMIC RANDOM ACCESS MEMORY (DRAM) CACHE TAGS

(71) Applicant: QUALCOMM Incorporated, San Diego, CA (US)

(72) Inventors: Natarajan Vaidhyanathan, Carrboro, NC (US); Mattheus Cornelis Antonius Adrianus Heddes, Raleigh, NC (US); Colin Beaton Verrilli, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 374 days.

(21) Appl. No.: 15/085,350

(22) Filed: Mar. 30, 2016

(65) Prior Publication Data

US 2017/0286214 A1 Oct. 5, 2017

(51) Int. Cl.
*G11C 29/00* (2006.01)
*G06F 11/10* (2006.01)
(Continued)

(52) U.S. Cl.
CPC ...... *G06F 11/1064* (2013.01); *G06F 12/0806* (2013.01); *G06F 12/0895* (2013.01);
(Continued)

(58) Field of Classification Search
CPC .. B41J 29/38; G06F 12/0806; G06F 12/0895; G06F 11/1064; G06F 12/00; G06F 12/08; G06F 13/28; G06F 15/00; G06F 2212/1008; G06F 2212/40; G06F 2212/403; G06F 2212/621; G06F 2212/7209; G06F 9/30; G11C 7/1072
See application file for complete search history.

(56) References Cited

U.S. PATENT DOCUMENTS 7,650,557 B2 1/2010 Totolos, Jr.
8,464,007 B2 6/2013 Abts et al.
(Continued)

OTHER PUBLICATIONS

International Search Report and Written Opinion for PCT/US2017/020620, dated May 30, 2017, 12 pages.
(Continued)

*Primary Examiner* — Albert Decady
*Assistant Examiner* — Enamul M Kabir
(74) *Attorney, Agent, or Firm* — Withrow & Terranova, PLLC

(57) ABSTRACT

Providing space-efficient storage for dynamic random access memory (DRAM) cache tags is provided. In one aspect, a DRAM cache management circuit provides a plurality of cache entries, each of which contains a tag storage region, a data storage region, and an error protection region. The DRAM cache management circuit is configured to store data to be cached in the data storage region of each cache entry. The DRAM cache management circuit is also configured to use an error detection code (EDC) instead of an error correcting code (ECC), and to store a tag and the EDC for each cache entry in the error protection region of the cache entry. In this manner, the capacity of a DRAM cache can be increased by avoiding the need for the tag storage region for each cache entry, while still providing error detection for the cache entry.

22 Claims, 8 Drawing Sheets

(51) Int. Cl.

| | |
|---|---|
| ***G11C 7/10*** | (2006.01) |
| ***G06F 12/0806*** | (2016.01) |
| ***G06F 12/0895*** | (2016.01) |

(52) U.S. Cl.

CPC .... *G11C 7/1072* (2013.01); *G06F 2212/1008* (2013.01); *G06F 2212/40* (2013.01); *G06F 2212/403* (2013.01); *G06F 2212/621* (2013.01); *G06F 2212/7209* (2013.01)

(56) References Cited

U.S. PATENT DOCUMENTS

| | | | | |
|---|---|---|---|---|
| 8,826,097 | B2 | 9/2014 | Özer et al. | |
| 9,058,290 | B2 | 6/2015 | Chan et al. | |
| 2007/0260820 | A1* | 11/2007 | Qureshi | G06F 11/1064 711/141 |
| 2012/0297256 | A1* | 11/2012 | Plondke | G06F 11/1064 714/54 |
| 2013/0268822 | A1 | 10/2013 | Manoochehri et al. | |
| 2013/0346695 | A1* | 12/2013 | Loh | G06F 12/0895 711/122 |
| 2014/0019823 | A1* | 1/2014 | Ramirez | G06F 11/1064 714/755 |
| 2014/0149651 | A1* | 5/2014 | Forsyth | G06F 12/123 711/105 |
| 2014/0244932 | A1* | 8/2014 | Hebbar | G06F 12/0875 711/122 |
| 2016/0139989 | A1* | 5/2016 | Muralimanohar | G06F 11/1012 714/764 |

OTHER PUBLICATIONS

Second Written Opinion for PCT/US2017/020620, dated Mar. 5, 2018, 6 pages.

* cited by examiner

PROVIDING SPACE-EFFICIENT STORAGE FOR DYNAMIC RANDOM ACCESS MEMORY (DRAM) CACHE TAGS

BACKGROUND

I. Field of the Disclosure

The technology of the disclosure relates generally to dynamic random access memory (DRAM) management, and, in particular, to management of DRAM caches.

II. Background

The advent of die-stacked integrated circuits (ICs) composed of multiple stacked dies that are vertically interconnected has enabled the development of die-stacked dynamic random access memory (DRAM). Die-stacked DRAMs may be used to implement what is referred to herein as "high-bandwidth memory." High-bandwidth memory provides greater bandwidth than conventional system memory DRAM, while providing similar access latency. In some implementations, high-bandwidth memory may also be "near" memory, or memory that is physically located closer to a memory interface than other system memory DRAM. High-bandwidth memory may be used to implement a DRAM cache to store frequently accessed data that was previously read from a system memory DRAM and/or evicted from a higher level cache, such as a Level 3 (L3) cache, as a non-limiting example. Providing a DRAM cache in high-bandwidth memory may reduce memory contention on the system memory DRAM, and thus, in effect, increase overall memory bandwidth.

As with other conventional caches, each cache entry within the DRAM cache includes a tag storage region, a data storage region, and an error protection region. The tag storage region may be used to store a tag, which serves as a unique identifier for the cache entry. Cached data is stored in the data storage region of the cache entry, while the error protection region may store an error correcting code (ECC) that enables the DRAM cache to detect and correct corruption of the cached data within the cache entry. As a non-limiting example, the ECC may include a single-error correction and double-error detection (SECDED) code, enabling the DRAM cache to correct single-bit errors within the cached data and to detect double-bit errors within the cached data.

However, the amount of data that can be stored within the DRAM cache may be negatively impacted by the amount of the DRAM cache that is dedicated to tag storage. For example, in a DRAM cache implementation in which each cache entry is 64 bytes long, each tag may be five (5) bytes in size, thus consuming nearly eight (8) percent of memory available to the DRAM cache. The memory access granularity of the DRAM cache implementation may exacerbate this issue by causing the tag to occupy more than five (5) bytes of the cache entry. Thus, it is desirable to provide a space-efficient mechanism for storing DRAM cache tags to increase the effective memory capacity of the DRAM cache.

SUMMARY OF THE DISCLOSURE

Aspects disclosed in the detailed description include providing space-efficient storage for dynamic random access memory (DRAM) cache tags. In some aspects, a DRAM cache management circuit is provided to manage access to a DRAM cache that is part of a high-bandwidth memory.

The DRAM cache includes a plurality of cache entries, each of which contains a tag storage region, a data storage region, and an error protection region. In some aspects of the DRAM cache, the tag storage region may be five (5) bytes long, the data storage region may be 64 bytes long, and the error protection region may be eight (8) bytes long. In some aspects, the tag storage region may be larger or smaller than five (5) bytes, while some aspects may provide that the data storage region is larger or smaller (e.g., 32 bytes or 128 bytes, as non-limiting examples), with the error protection region being correspondingly sized. The DRAM cache management circuit is configured to store data to be cached in the data storage region of each cache entry. The DRAM cache management circuit is also configured to use an error detection code (EDC) instead of an error correcting code (ECC), and to store the tag and the EDC for each cache entry in the error protection region of the cache entry. As a non-limiting example, the EDC may comprise a cyclic redundancy check (CRC) that occupies 11 bits, with the remaining 53 bits of the error protection region of the cache entry used to store the tag for the cache entry and/or metadata related to the data stored in the cache entry (e.g., compression and/or security attributes, as non-limiting examples). In this manner, the capacity of the DRAM cache can be increased by eliminating or reducing the size of the tag storage region of each cache entry, while still providing error detection for the cache entry.

Further aspects of the DRAM cache management circuit may be configured to operate in a write-through mode or a write-back mode. In aspects of the DRAM cache management circuit that operate in the write-through mode, the data that is stored in the DRAM cache is also written to a system memory DRAM protected by an ECC, thus guaranteeing that the DRAM cache and the system memory DRAM are always synchronized and that the system memory DRAM contains uncorrupted data. Thus, if the EDC of a cache entry indicates that an error has been detected within the data stored in the cache entry, the DRAM cache management circuit can read a memory line in the system memory DRAM that corresponds to the cache entry to obtain uncorrupted data. In aspects of the DRAM cache management circuit that operate in the write-back mode, the DRAM cache management circuit may further provide a plurality of dirty indicators corresponding to the plurality of cache entries of the DRAM cache. When a cache entry is accessed, the DRAM cache management circuit may use the cache entry's dirty indicator to determine if the cache entry stores clean (i.e., unmodified) or dirty (i.e., modified) data. The DRAM cache management circuit may employ the tag storage region using the EDC as described above for cache entries that store clean data. For cache entries that store dirty data, the DRAM cache management circuit may use an ECC as with conventional caches. The DRAM cache management circuit may also store an error code indicator within the error protection region of each cache entry to indicate whether the cache entry uses an EDC or an ECC for error detection.

In another aspect, a processor-based system is provided. The processor-based system comprises a DRAM cache that is part of a high-bandwidth memory. The DRAM cache comprises a plurality of cache entries each providing a data storage region and an error protection region. The processor-based system further comprises a DRAM cache management circuit that is located on a compute die of the processor-based system, and that is communicatively coupled to the DRAM cache. The DRAM cache management circuit is configured to write data to be cached in the data storage region of a cache entry of the plurality of cache entries of the DRAM cache. The DRAM cache management circuit is further configured to write a tag and an EDC for the cache entry in the error protection region of the cache entry.

In another aspect, a processor-based system including a DRAM cache management circuit is provided. The DRAM cache management circuit comprises a means for writing data to be cached in a data storage region of a cache entry of a plurality of cache entries of a DRAM cache that is part of a high-bandwidth memory. The DRAM cache management circuit further comprises a means for writing a tag and an EDC for the cache entry in an error protection region of the cache entry.

In another aspect, a method for providing space-efficient storage of DRAM cache tags in a DRAM cache. The method comprises writing, by a DRAM cache management circuit, data to be cached in a data storage region of a cache entry of a plurality of cache entries of a DRAM cache that is part of a high-bandwidth memory. The method further comprises writing a tag and an EDC for the cache entry in an error protection region of the cache entry.

In another aspect, a non-transitory computer-readable medium is provided. The non-transitory computer-readable medium stores computer executable instructions which, when executed by a processor, cause the processor to write data to be cached in a data storage region of a cache entry of a plurality of cache entries of a DRAM cache that is part of a high-bandwidth memory. The non-transitory computer-readable medium further stores computer executable instructions which, when executed by the processor, cause the processor to write a tag and an EDC for the cache entry in an error protection region of the cache entry.

DETAILED DESCRIPTION

Figure 1:
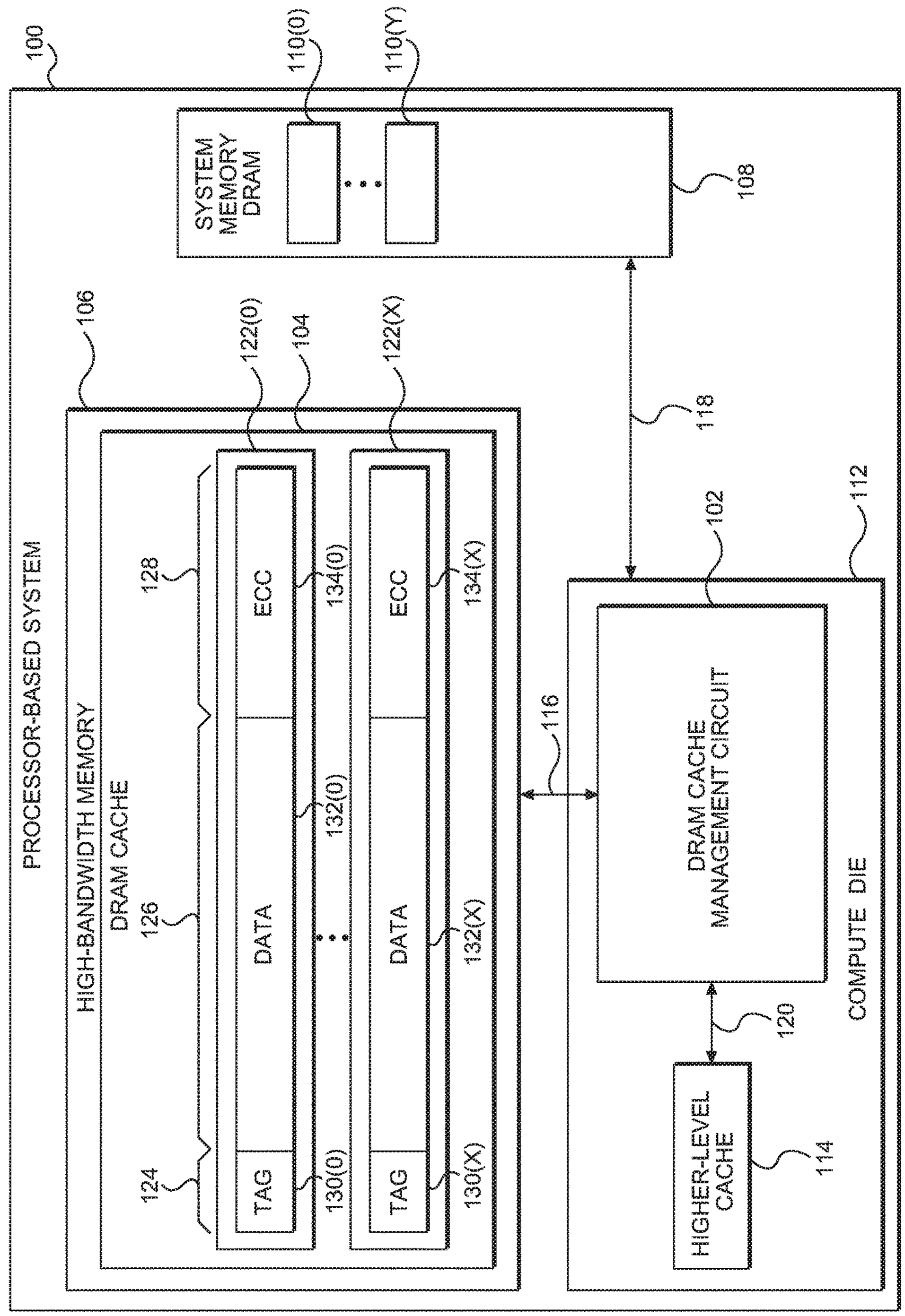
FIG. 1 is a block diagram of an exemplary processor-based system including a high-bandwidth memory providing a dynamic random access memory (DRAM) cache, and a conventional DRAM cache management circuit for accessing the DRAM cache.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include providing space-efficient storage for dynamic random access memory (DRAM) cache tags. In this regard, in some aspects, a DRAM cache management circuit is provided. The DRAM cache management circuit is configured to store data to be cached in a data storage region of each cache entry within a DRAM cache. The DRAM cache management circuit is also configured to use an error detection code (EDC) instead of an error correcting code (ECC), and to store a tag and the EDC for each cache entry in an error protection region of the cache entry. In this manner, the need for a tag storage region for each cache entry may be eliminated or reduced, thus increasing the effective memory capacity of the DRAM cache while still providing error detection capabilities.

Before discussing exemplary elements and operations of the DRAM cache management circuit for providing space-efficient DRAM cache tags, the structure of a conventional DRAM cache is described. Accordingly, in this regard, FIG. 1 is a block diagram of a processor-based system 100 that provides a DRAM cache management circuit 102 for managing a DRAM cache 104 that is part of a high-bandwidth memory 106. The processor-based system 100 includes a system memory DRAM 108, which, in some aspects, may comprise one or more dual in-line memory modules (DIMMs). The system memory DRAM 108 is subdivided into memory lines 110(0)-110(Y) in which data is stored. The processor-based system 100 further provides a compute die 112, on which a higher-level cache 114 is located. In some aspects, the higher-level cache 114 may comprise a Level 3 (L3) cache, as a non-limiting example. The DRAM cache management circuit 102 is located on the compute die 112, and is communicatively coupled to the high-bandwidth memory 106 and the system memory DRAM 108, as indicated by bidirectional arrows 116 and 118. The DRAM cache management circuit 102 may also be read from and written to by the higher-level cache 114, as indicated by bidirectional arrow 120.

The processor-based system 100 of FIG. 1 may encompass any one of known digital logic elements, semiconductor circuits, processing cores, and/or memory structures, among other elements, or combinations thereof. Aspects described herein are not restricted to any particular arrangement of elements, and the disclosed techniques may be easily extended to various structures and layouts on semiconductor dies or packages. It is to be understood that some aspects of the processor-based system 100 may include elements in addition to those illustrated in FIG. 1.

To improve memory bandwidth, the DRAM cache 104 within the high-bandwidth memory 106 of the processor-based system 100 may be used by the DRAM cache management circuit 102 to cache data (not shown) that was previously read from one or more of the memory lines 110(0)-110(Y) of the system memory DRAM 108, and/or evicted from the higher-level cache 114. As non-limiting examples, some aspects may provide that data may be cached in the DRAM cache 104 only upon reading the data from the system memory DRAM 108, while in some aspects data may be cached in the DRAM cache 104 only when evicted from the higher-level cache 114. According to some aspects, data may be cached in the DRAM cache 104 upon reading data from the system memory DRAM 108 for reads triggered by processor loads and dirty evictions from the higher-level cache 114.

The DRAM cache 104 within the high-bandwidth memory 106 may be accessed independently of the system memory DRAM 108. As a result, memory bandwidth may be effectively increased by reading from both the DRAM cache 104 and the system memory DRAM 108 at the same time. In some aspects, the DRAM cache 104 may implement a random replacement policy to determine candidates for eviction within the DRAM cache 104.

The DRAM cache 104 provides a plurality of cache entries 122(0)-122(X) in which cached data may be stored. Each of the cache entries 122(0)-122(X) is made up of a tag storage region 124, a data storage region 126, and an error protection region 128. It is to be understood that the tag storage region 124, the data storage region 126, and the error protection region 128 are shown in FIG. 1 as being stored contiguously for the sake of illustration only. In some aspects, the tag storage region 124, the data storage region 126, and the error protection region 128 may be implemented as separate data structures or memory regions. According to some aspects of the DRAM cache 104, each of the cache entries 122(0)-122(X) is associated with the tag storage region 124 occupying five (5) bytes, the data storage region 126 occupying 64 bytes, and the error protection region 128 occupying eight (8) bytes. It is to be understood that, in some aspects, the tag storage region 124 may be larger or smaller than shown in the example of FIG. 1. It is to be further understood that the data storage region 126 according to some aspects may be larger or smaller than shown in the example of FIG. 1 (e.g., 32 bytes or 128 bytes, as non-limiting examples) with the error protection region 128 being correspondingly sized.

The tag storage region 124 of the cache entries 122(0)-122(X) is conventionally used to store corresponding tags 130(0)-130(X), which serve as unique identifiers for the cache entries 122(0)-122(X). Data 132(0)-132(X) is stored in the data storage region 126 of the cache entries 122(0)-122(X). The error protection region 128 of the cache entries 122(0)-122(X) may store ECCs 134(0)-134(X) that enable detection and correction of corruption of the data 132(0)-132(X) within the cache entry 122(0)-122(X). As a non-limiting example, the ECCs 134(0)-134(X) each may include a single-error correction and double-error detection (SECDED) code, enabling single-bit errors within the corresponding data 132(0)-132(X) to be corrected and double-bit errors within the data 132(0)-132(X) to be detected.

However, the amount of data 132(0)-132(X) that can be stored within the DRAM cache 104 may be constrained by the amount of the DRAM cache 104 that is dedicated to storing the tags 130(0)-130(X). For example, in an implementation of the DRAM cache 104 in which each of the cache entries 122(0)-122(X) is 64 bytes long, each of the tags 130(0)-130(X) may be as large as five (5) bytes, thus consuming nearly eight (8) percent of the memory available to the DRAM cache 104. In aspects of the DRAM cache 104 in which memory access granularity of the DRAM cache 104 is larger than five (5) bytes, each of the tags 130(0)-130(X) may actually occupy more than five (5) bytes of its corresponding cache entry 122(0)-122(X). Thus, it is desirable to provide a space-efficient mechanism for storing the tags 130(0)-130(X) to increase the effective memory capacity of the DRAM cache 104.

Figure 2:
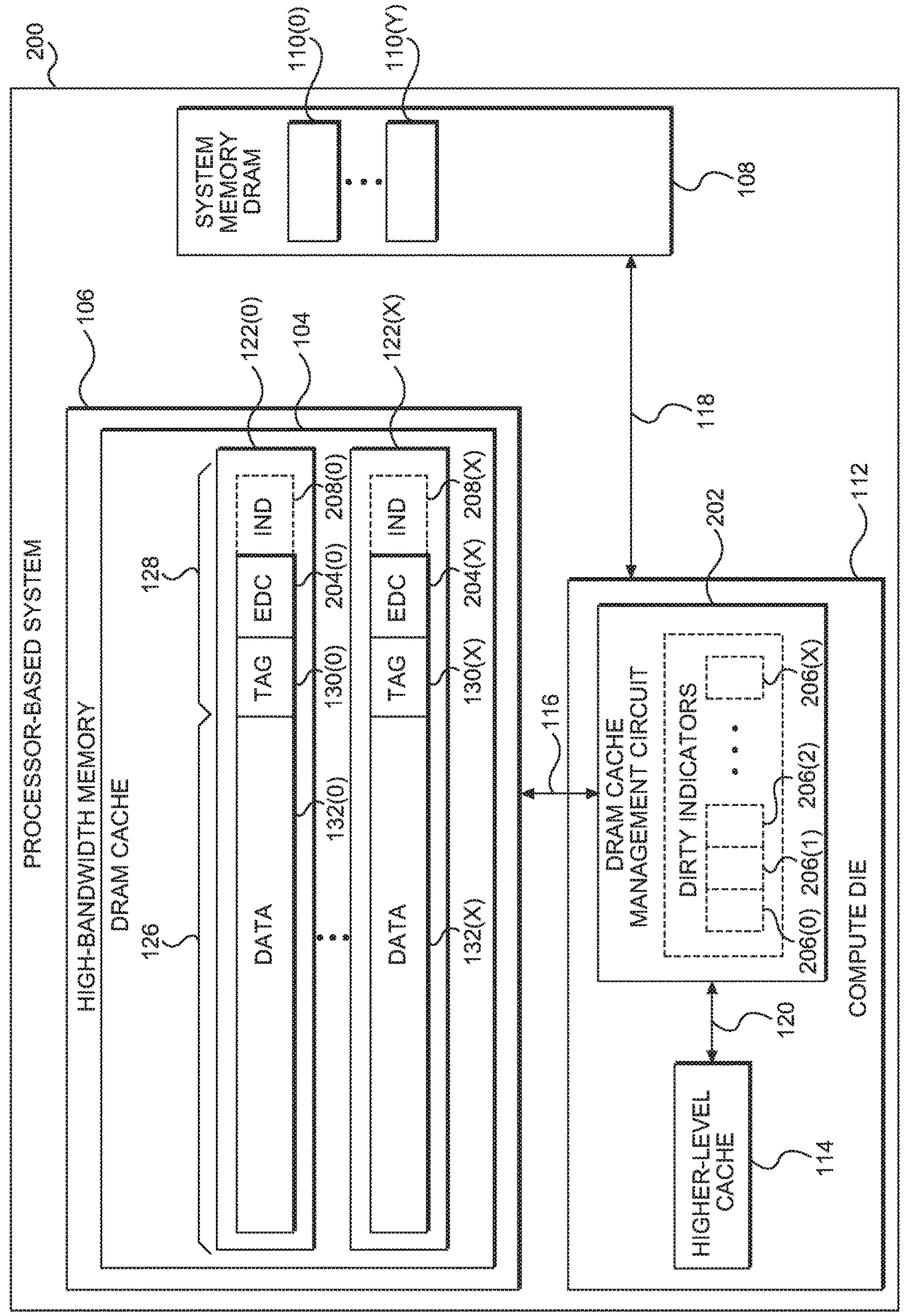
FIG. 2 is a block diagram of an exemplary processor-based system including a DRAM cache management circuit configured to provide space-efficient storage of DRAM cache tags within a DRAM cache.

In this regard, FIG. 2 is provided to illustrate an exemplary processor-based system 200 including a DRAM cache management circuit 202 configured to provide space-efficient storage of the tags 130(0)-130(X) within the DRAM cache 104. For purposes of clarity, elements of FIG. 1 are referenced in describing FIG. 2. As seen in FIG. 2, the DRAM cache management circuit 202 is configured to repurpose the error protection region 128 to provide greater storage capacity for the data 132(0)-132(X) and more efficient storage of the tags 130(0)-130(X). To accomplish these goals, the DRAM cache management circuit 202 relies on EDCs 204(0)-204(X) instead of the ECCs 134(0)-134(X) of FIG. 1 for detecting errors in the data 132(0)-132(X) stored in the cache entries 122(0)-122(X). As a non-limiting example, the EDCs 204(0)-204(X) may comprise a cyclic redundancy check (CRC) that occupies 11 bits. Because each of the EDCs 204(0)-204(X) is much smaller than the ECCs 134(0)-134(X) (e.g., 11 bits versus 64 bits, in some aspects), the DRAM cache management circuit 202 can store both the EDCs 204(0)-204(X) and the tags 130(0)-130(X) for the corresponding cache entries 122(0)-122(X) in the error protection region 128. In this manner, the DRAM cache management circuit 202 may avoid or reduce the need to provide the tag storage region 124 of FIG. 1, thus effectively increasing the capacity of the DRAM cache 104.

Unlike the ECCs 134(0)-134(X), the EDCs 204(0)-204(X) cannot be used to correct detected errors in the data 132(0)-132(X), but rather only to detect such errors. Upon detection of an error within one of the cache entries 122(0)-122(X), the DRAM cache management circuit 202 may read one of the memory lines 110(0)-110(Y) corresponding to the cache entry 122(0)-122(X) from the system memory DRAM 108 to retrieve uncorrupted data. For this reason, in some aspects of the DRAM cache management circuit 202, the example illustrated in FIG. 2 may be used only when writing data that is known to be clean to the DRAM cache 104. For example, some aspects of the DRAM cache management circuit 202 may be configured to operate in a write-through mode, in which all data that is stored in the DRAM cache 104 is also written to the system memory DRAM 108. Because the DRAM cache 104 and the system memory DRAM 108 are always synchronized, the example illustrated in FIG. 2 may be used for all data 132(0)-132(X) written to and read from the DRAM cache 104.

In aspects of the DRAM cache management circuit 202 that operate in the write-back mode, the data 132(0)-132(X) stored in each of the cache entries 122(0)-122(X) of the DRAM cache 104 may be clean or dirty. Thus, the DRAM cache management circuit 202 in such aspects may provide a plurality of dirty indicators 206(0)-206(X) corresponding to the plurality of cache entries 122(0)-122(X) of the DRAM cache 104. When writing to a cache entry 122(0)-122(X) such as the cache entry 122(0) of the DRAM cache 104, the DRAM cache management circuit 202 may determine whether the data 132(0) to be written is clean (e.g., data 132(0) read from the system memory DRAM 108 and/or clean data 132(0) evicted from the higher-level cache 114) or dirty (e.g., dirty data 132(0) evicted from the higher-level cache 114). The DRAM cache management circuit 202 may then set a dirty indicator 206(0) corresponding to the cache entry 122(0) accordingly. If the data 132(0) is clean, the data 132(0), the tag 130(0), and the EDC 204(0) may be stored in the cache entry 122(0) as illustrated in FIG. 2. However, if the data 132(0) is dirty, the data 132(0), the tag 130(0), and the ECC 134(0) may be stored in the cache entry 122(0) in the conventional manner as shown in FIG. 1. The dirty indicators 206(0)-206(X) may also be used by the DRAM cache management circuit 202 when reading the cache entry 122(0) from the DRAM cache 104 to determine how the data 132(0) and the tag 130(0) are stored within the cache entry

122(0), and to indicate which form of error protection (the EDC 204(0) or the ECC 134(0)) is in use for the cache entry 122(0).

In some aspects of the processor-based system 200, other processes being executed by the processor-based system 200 and accessing the DRAM cache 104 may require a mechanism for determining what form of error protection is in use for each of the cache entries 122(0)-122(X) of the DRAM cache 104. As a non-limiting example, the processor-based system 200 may provide a "scrubber" process (not shown) that runs periodically or continuously to check the cache entries 122(0)-122(X) for single-bit data errors, and to correct any detected errors. To facilitate such a process, each cache entry 122(0)-122(X) of the DRAM cache 104 may store a corresponding error code indicator (IND) 208(0)-208(X) to indicate whether the cache entry 122(0)-122(X) uses the EDC 204(0)-204(X) or the ECC 134(0)-134(X) for error detection.

According to some aspects, the DRAM cache management circuit 202 may be configured to use a Reed-Solomon code as the ECCs 134(0)-134(X). A Reed-Solomon code may be smaller than other conventional ECC codes, and thus may provide extra bits within the error protection region 128 to store the error code indicators 208(0)-208(X) in aspects in which the ECCs 134(0)-134(X) are used. In some aspects, each of the error code indicators 208(0)-208(X) may comprise an odd-numbered plurality of bits (not shown) all set to the same value. If one of the odd-numbered plurality of bits becomes corrupted, the form of error protection may still be determined by a value of a majority of the plurality of bits.

Figure 3:
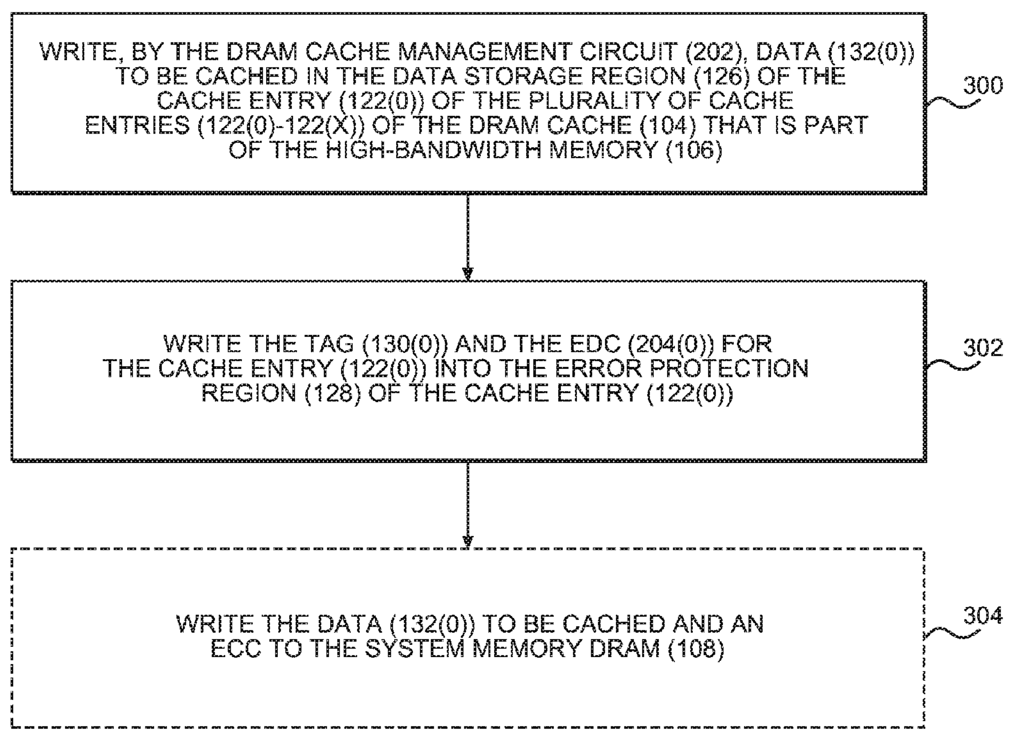
FIG. 3 is a flowchart illustrating exemplary operations of the DRAM cache management circuit of FIG. 2 for performing a memory write operation using the DRAM cache of FIG. 1.

FIG. 3 is a flowchart illustrating exemplary operations of the DRAM cache management circuit 202 of FIG. 2 for performing a memory write operation using the DRAM cache 104 of FIG. 1. For the sake of clarity, elements of FIGS. 1 and 2 are referenced in describing FIG. 3. In FIG. 3, operations begin with the DRAM cache management circuit 202 writing the data 132(0) to be cached in the data storage region 126 of the cache entry 122(0) of the plurality of cache entries 122(0)-122(X) of the DRAM cache 104 that is part of the high-bandwidth memory 106 (block 300). In this regard, the DRAM cache management circuit 202 may be referred to herein as "a means for writing data to be cached in a data storage region of a cache entry of a plurality of cache entries of a DRAM cache that is part of a high-bandwidth memory." The DRAM cache management circuit 202 then writes the tag 130(0) and the EDC 204(0) of the cache entry 122(0) into the error protection region 128 for the cache entry 122(0) (block 302). Accordingly, the DRAM cache management circuit 202 may be referred to herein as "a means for writing a tag and an EDC for the cache entry in an error protection region of the cache entry." In this manner, the DRAM cache management circuit 202 provides space-efficient storage of the tag 130(0) while increasing the memory capacity of the DRAM cache 104.

As described above, some aspects of the DRAM cache management circuit 202 may employ the operations of FIG. 3 when performing a write of the data 132(0) that is known to be clean, such as when operating in a write-through mode. In an aspect implementing a write-through mode, the DRAM cache management circuit 202 further writes the data 132(0) to be cached, along with an ECC for the data 132(0), to the system memory DRAM 108 (block 304). In this manner, contents of the DRAM cache 104 and the system memory DRAM 108 are always synchronized, with the system memory DRAM 108 containing uncorrupted data.

Figure 4:
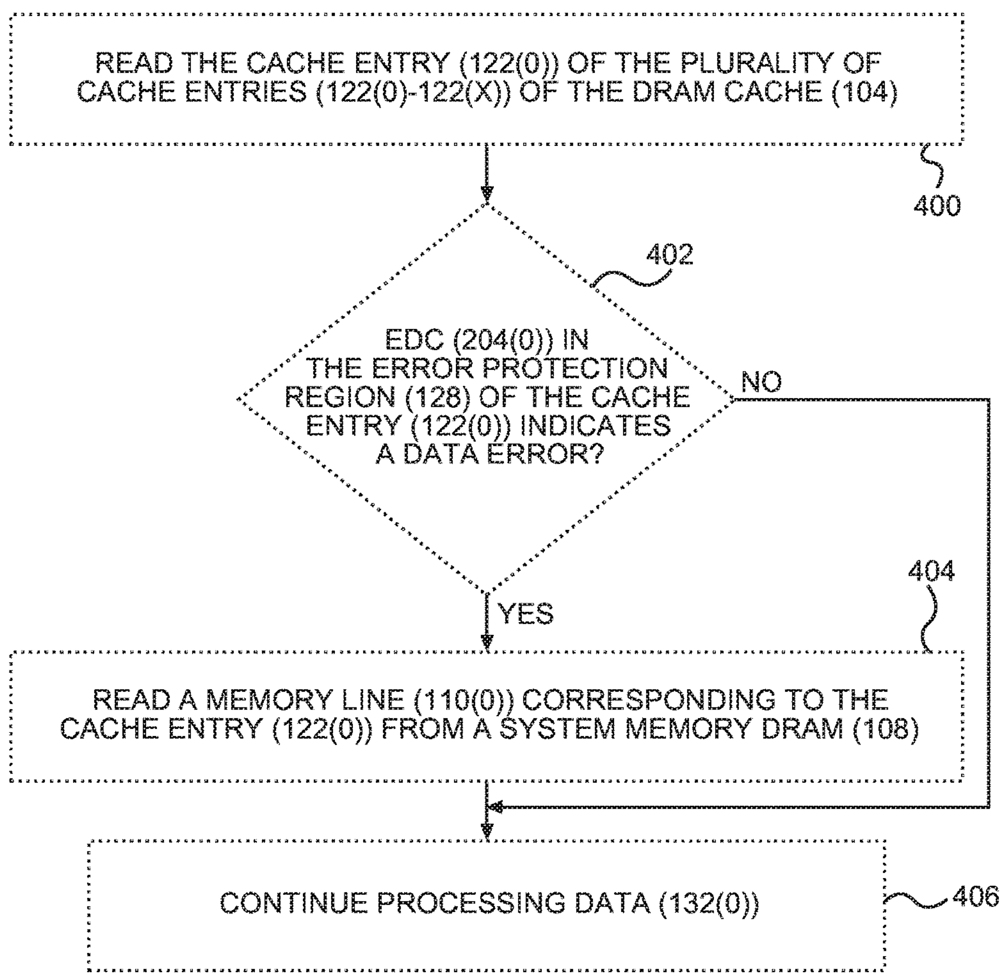
FIG. 4 is a flowchart illustrating exemplary operations of the DRAM cache management circuit of FIG. 2 for performing a memory read operation using the DRAM cache of FIG. 1.

To illustrate exemplary operations of the DRAM cache management circuit 202 of FIG. 2 for performing a memory read operation using the DRAM cache 104 of FIG. 1, FIG. 4 is provided. Elements of FIGS. 1 and 2 are referenced in describing FIG. 4, for the sake of clarity. Operations in FIG. 4 begin with the DRAM cache management circuit 202 reading the cache entry 122(0) of the plurality of cache entries 122(0)-122(X) of the DRAM cache 104 (block 400). The DRAM cache management circuit 202 then determines whether the EDC 204(0) in the error protection region 128 of the cache entry 122(0) indicates a data error (block 402). If the EDC 204(0) indicates a data error, the DRAM cache management circuit 202 may read a memory line 110(0) corresponding to the cache entry 122(0) from the system memory DRAM 108 (block 404). Because the system memory DRAM 108 is protected by an ECC, an uncorrupted copy of the data 132(0) may be obtained from the system memory DRAM 108. In this manner, performance of the DRAM cache management circuit 202 may be optimized for the more common case in which no data corruption has occurred, while incurring a penalty when reading from the system memory DRAM 108 in the relatively uncommon case of data corruption.

The DRAM cache management circuit 202 then continues processing the data 132(0) (e.g., by providing the data 132(0) to a requesting cache or process) (block 406). If the DRAM cache management circuit 202 determines at decision block 402 that the EDC 204(0) does not indicate a data error, processing resumes at block 406. As with FIG. 3, some aspects of the DRAM cache management circuit 202 may employ the operations of FIG. 4 when performing a read of the data 132(0) that is known to be clean.

Figure 5A:
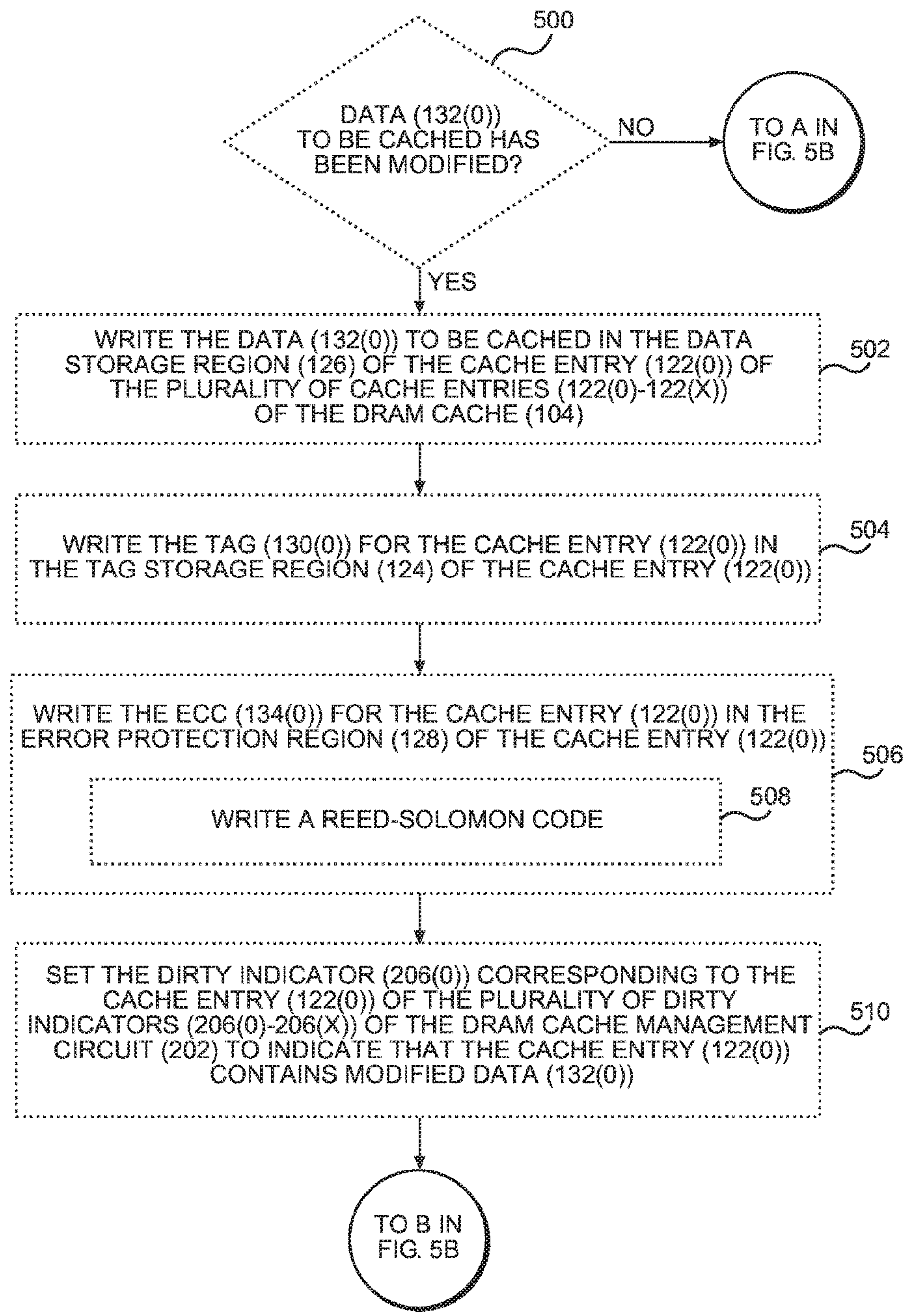
FIGS. 5A and 5B are flowcharts illustrating exemplary operations of the DRAM cache management circuit of FIG. 2 for performing a memory write operation in a write-back mode.
Figure 5B:
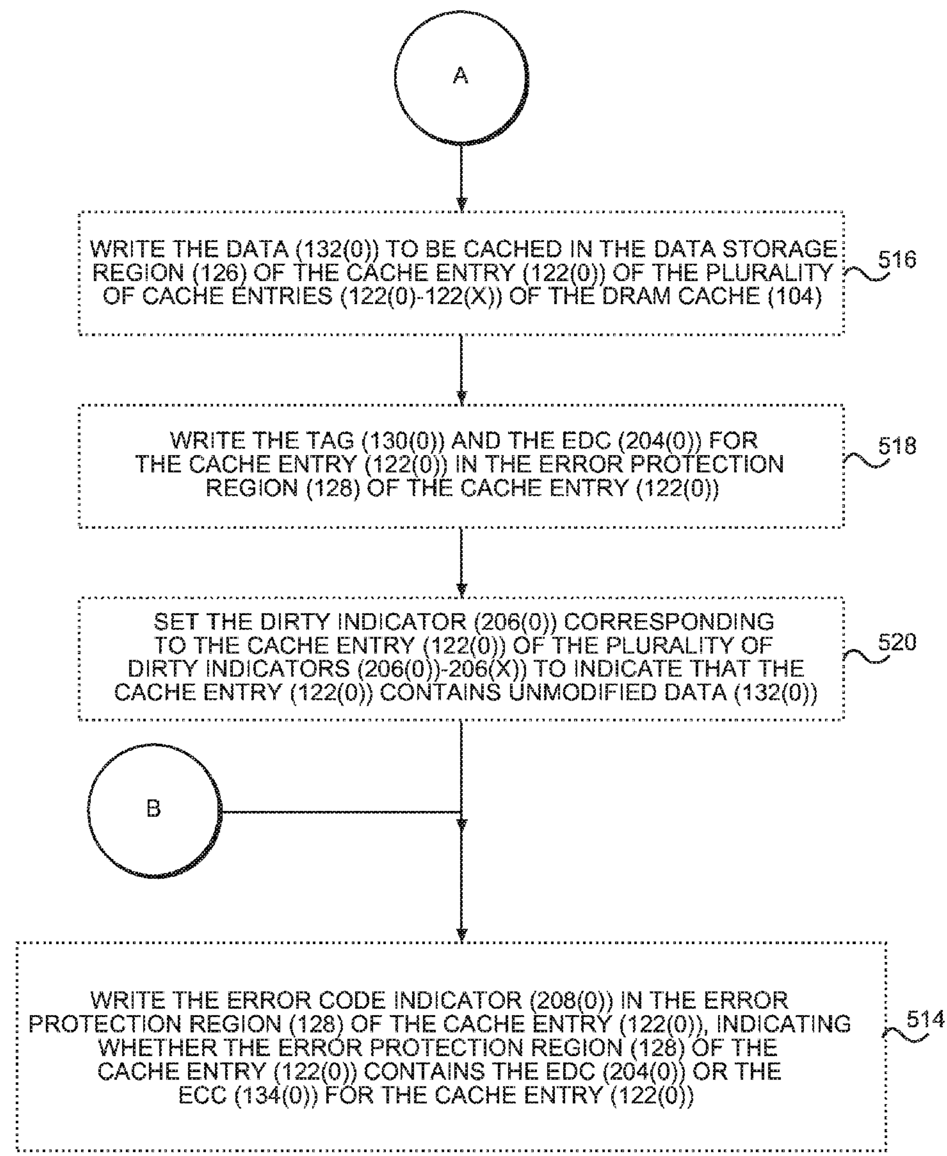

FIGS. 5A and 5B are flowcharts illustrating exemplary operations of the DRAM cache management circuit 202 of FIG. 2 for performing a memory write operation when configured to operate in a write-back mode. For the sake of clarity, elements of FIGS. 1 and 2 are referenced in describing FIGS. 5A and 5B. Referring now to FIG. 5A, operations begin with the DRAM cache management circuit 202 determining whether the data 132(0) to be cached has been modified (block 500). As a non-limiting example, the data 132(0) to be cached may comprise dirty data 132(0) evicted from the higher-level cache 114. If the data 132(0) has been modified (i.e., the data 132(0) is dirty), the DRAM cache management circuit 202 proceeds with a memory write operation similar to a conventional write operation. The DRAM cache management circuit 202 writes the data 132 (0) to be cached in the data storage region 126 of the cache entry 122(0) of the plurality of cache entries 122(0)-122(X) of the DRAM cache 104 (block 502). The DRAM cache management circuit 202 next writes the tag 130(0) for the cache entry 122(0) in the tag storage region 124 of the cache entry 122(0) (block 504). The DRAM cache management circuit 202 also writes an ECC 134(0) for the cache entry 122(0) in the error protection region 128 of the cache entry 122(0) (block 506). In some aspects, the DRAM cache management circuit 202 may perform the operations of block 506 for writing the ECC 134(0) by writing a Reed-Solomon code (block 508). The DRAM cache management circuit 202 then sets the dirty indicator 206(0) corresponding to the cache entry 122(0) of the plurality of dirty indicators 206(0)-206(X) of the DRAM cache management circuit 202 to indicate that the cache entry 122(0) contains modified data 132(0) (block 510). Processing then resumes at block 514 of FIG. 5B.

Turning now to FIG. 5B, if the DRAM cache management circuit 202 determines at decision block 500 of FIG. 5A that the data 132(0) has not been modified (i.e., the data 132(0) is clean), the DRAM cache management circuit 202 proceeds with a memory write operation similar to that shown in FIG. 3. The DRAM cache management circuit 202 writes the data 132(0) to be cached in the data storage region 126 of the cache entry 122(0) of the plurality of cache entries 122(0)-122(X) of the DRAM cache 104 (block 516). The DRAM cache management circuit 202 next writes the tag 130(0) and the EDC 204(0) for the cache entry 122(0) in the error protection region 128 of the cache entry 122(0) (block 518). The DRAM cache management circuit 202 then sets the dirty indicator 206(0) corresponding to the cache entry 122(0) of the plurality of dirty indicators 206(0)-206(X) to indicate that the cache entry 122(0) contains unmodified data 132(0) (block 520). In some aspects, the DRAM cache management circuit 202 may also write the error code indicator 208(0) in the error protection region 128 of the cache entry 122(0), indicating whether the error protection region 128 of the cache entry 122(0) contains the EDC 204(0) or the ECC 134(0) for the cache entry 122(0) (block 514).

Figure 6:
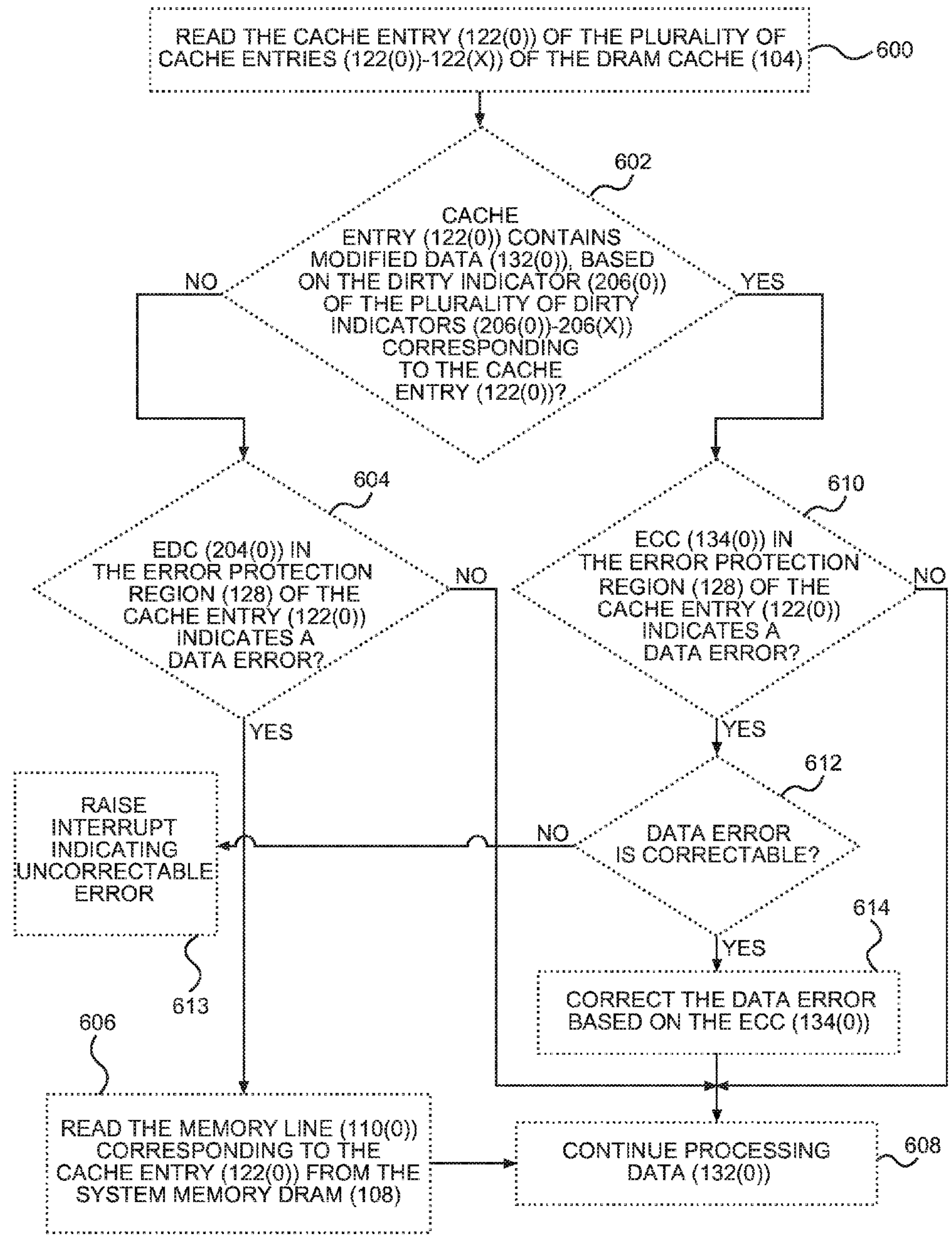
FIG. 6 is a flowchart illustrating exemplary operations of the DRAM cache management circuit of FIG. 2 for performing a memory read operation in a write-back mode.

To illustrate exemplary operations of the DRAM cache management circuit 202 of FIG. 2 for performing a memory read operation when configured to operate in a write-back mode, FIG. 6 is provided. Elements of FIGS. 1 and 2 are referenced in describing FIG. 6, for the sake of clarity. In FIG. 6, operations begin with the DRAM cache management circuit 202 reading the cache entry 122(0) of the plurality of cache entries 122(0)-122(X) of the DRAM cache 104 (block 600). The DRAM cache management circuit 202 determines whether the cache entry 122(0) contains modified data 132(0) (i.e., dirty data 132(0)), based on the dirty indicator 206(0) of the plurality of dirty indicators 206(0)-206(X) corresponding to the cache entry 122(0) (block 602). If the cache entry 122(0) does not contain modified data 132(0), the DRAM cache management circuit 202 next determines whether the EDC 204(0) in the error protection region 128 of the cache entry 122(0) indicates a data error (block 604). If not, processing resumes at block 608. However, if the DRAM cache management circuit 202 determines at decision block 604 that the EDC 204(0) in the error protection region 128 of the cache entry 122(0) does indicate a data error, the DRAM cache management circuit 202 reads the memory line 110(0) corresponding to the cache entry 122(0) from the system memory DRAM 108 (block 606). In this manner, an uncorrupted copy of the data 132(0) may be obtained from the system memory DRAM 108. The DRAM cache management circuit 202 then continues processing the data 132(0) (e.g., by providing the data 132(0) to a requesting cache or process) (block 608).

If the DRAM cache management circuit 202 determines at decision block 602 that the cache entry 122(0) contains modified data 132(0), the DRAM cache management circuit 202 then determines whether the ECC 134(0) in the error protection region 128 of the cache entry 122(0) indicates a data error (block 610). If not, processing resumes at block 608. If the DRAM cache management circuit 202 determines at decision block 610 that the ECC 134(0) in the error protection region 128 of the cache entry 122(0) does indicates a data error, the DRAM cache management circuit 202 determines whether the data error is correctable (e.g., a single-bit error correctable by a SECDED ECC 134(0)) (block 612). If the data error cannot be corrected, the DRAM management circuit 202 may raise an interrupt to indicate that an uncorrectable error has occurred (block 613). However, if the data error is correctable, the DRAM cache management circuit 202 corrects the data error based on the ECC 134(0) (block 614). Processing then resumes at block 608.

Providing space-efficient storage for DRAM cache tags according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 7:
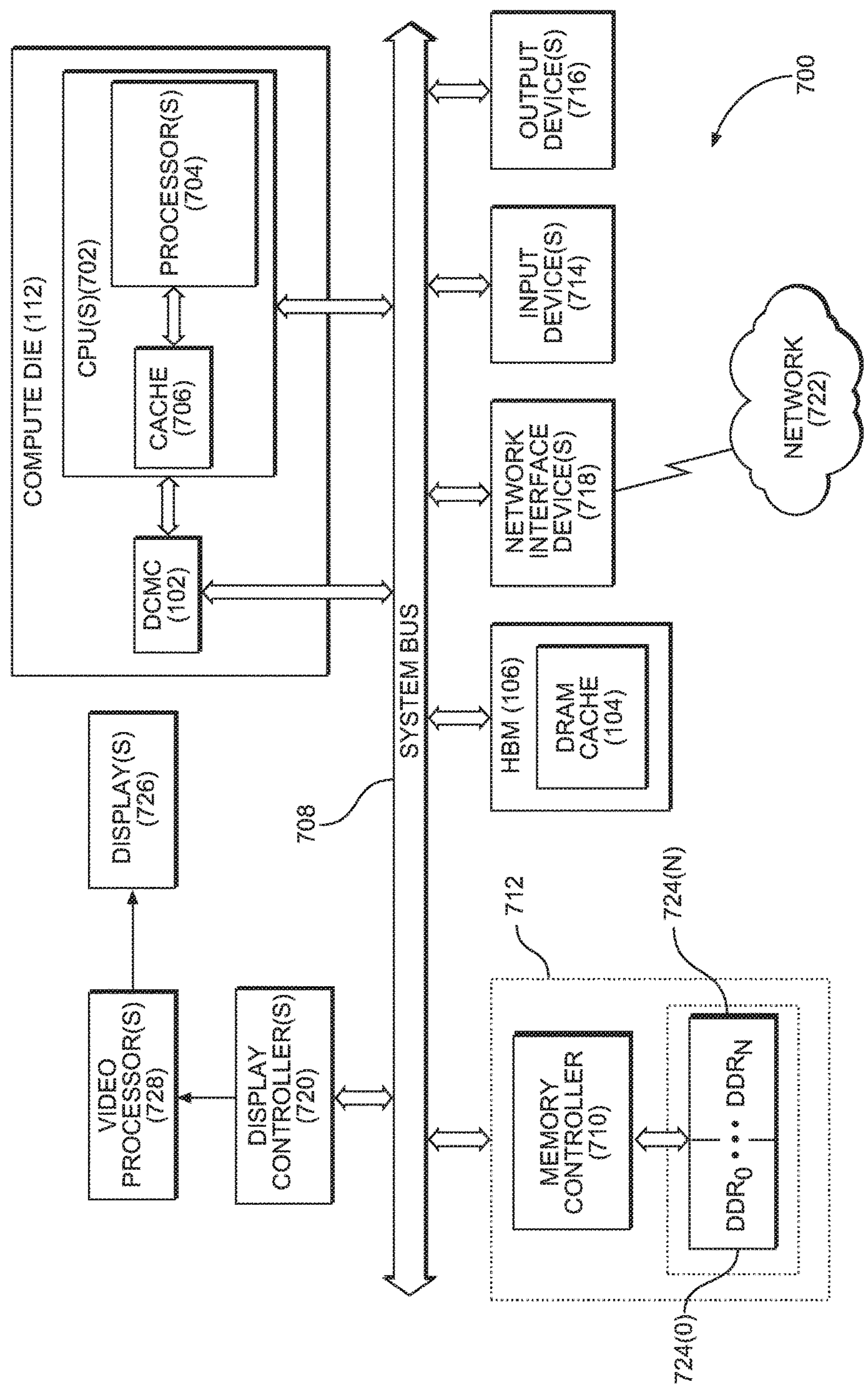
FIG. 7 is a block diagram of an exemplary processor-based system that can include the DRAM cache management circuit of FIG. 2.

In this regard, FIG. 7 illustrates an example of a processor-based system 700 that can employ the DRAM cache management circuit (DCMC) 102 illustrated in FIG. 1 for managing the DRAM cache 104 that is part of the high-bandwidth memory (HBM) 106. The processor-based system 700 includes the compute die 112 of FIG. 1, on which one or more central processing units (CPUs) 702, each including one or more processors 704, are provided. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including but not limited to input keys, switches, voice processors, etc. The output device(s) 716 can include any type of output device, including, but not limited to, audio, video, other visual indicators, etc. The network interface device(s) 718 can be any devices configured to allow exchange of data to and from a network 722. The network 722 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 718 can be configured to support any type of communications protocol desired. The memory system 712 can include one or more memory units 724(0)-724(N).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A processor-based system, comprising:
- a dynamic random access memory (DRAM) cache that is part of a high-bandwidth memory, the DRAM cache configured to provide a plurality of cache entries each comprising a tag storage region, a data storage region and an error protection region; and
- a DRAM cache management circuit located on a compute die of the processor-based system and communicatively coupled to the DRAM cache;
- the DRAM cache management circuit configured to:
  - repurpose the error protection region of a cache entry of the plurality of cache entries of the DRAM cache to store a tag and an error detection code (EDC) instead of an error correcting code (ECC) for the cache entry;
  - incorporate the tag storage region of the cache entry of the plurality of cache entries of the DRAM cache into the data storage region of the cache entry;
  - write data to be cached in the data storage region of the cache entry of the plurality of cache entries of the DRAM cache; and
  - write the tag and the EDC for the cache entry in the error protection region of the cache entry without writing an ECC in the error protection region of the cache entry.

2. The processor-based system of claim 1, wherein the DRAM cache management circuit is configured to operate in a write-through mode.

3. The processor-based system of claim 2, wherein the DRAM cache management circuit is further configured to:
- read the cache entry of the plurality of cache entries of the DRAM cache;
- determine whether the EDC for the cache entry in the error protection region of the cache entry indicates a data error; and
- responsive to determining that the EDC for the cache entry in the error protection region of the cache entry indicates a data error, read a memory line corresponding to the cache entry from a system memory DRAM.

4. The processor-based system of claim 1, wherein:
- the DRAM cache management circuit is configured to operate in a write-back mode;
- the DRAM cache management circuit comprises a plurality of dirty indicators corresponding to the plurality of cache entries of the DRAM cache; and
- the DRAM cache management circuit is further configured to:
  - determine whether the data to be cached has been modified;
  - responsive to determining that the data to be cached has been modified:

write the data to be cached in the data storage region of the cache entry of the plurality of cache entries of the DRAM cache;
write the tag for the cache entry in a tag storage region of the cache entry;
write an ECC for the cache entry in the error protection region of the cache entry; and
set a dirty indicator of the plurality of dirty indicators corresponding to the cache entry to indicate that the cache entry contains modified data; and
responsive to determining that the data to be cached has not been modified:
set a dirty indicator of the plurality of dirty indicators corresponding to the cache entry to indicate that the cache entry contains unmodified data;
wherein the DRAM cache management circuit is configured to repurpose the error protection region of the cache entry of the plurality of cache entries of the DRAM cache to store the tag and the EDC instead of an ECC for the cache entry, incorporate the tag storage region of the cache entry of the plurality of cache entries of the DRAM cache into the data storage region of the cache entry, write the data to be cached in the data storage region of the cache entry of the plurality of cache entries of the DRAM cache and write the tag and the EDC for the cache entry in the error protection region of the cache entry further responsive to determining that the data to be cached has not been modified.

5. The processor-based system of claim 4, wherein the DRAM cache management circuit is further configured to:
read the cache entry of the plurality of cache entries of the DRAM cache;
determine, based on the dirty indicator of the plurality of dirty indicators corresponding to the cache entry, whether the cache entry contains modified data;
responsive to determining that the cache entry contains modified data:
determine whether the ECC for the cache entry in the error protection region of the cache entry indicates a data error; and
responsive to determining that the ECC for the cache entry in the error protection region of the cache entry indicates a data error:
determine whether the data error is correctable;
responsive to determining that the data error is correctable, correct the data error based on the ECC; and
responsive to determining that the data error is not correctable, read a memory line corresponding to the cache entry from a system memory DRAM; and
responsive to determining that the cache entry does not contain modified data:
determine whether the EDC for the cache entry in the error protection region of the cache entry indicates a data error; and
responsive to determining that the EDC for the cache entry in the error protection region of the cache entry indicates a data error, read the memory line corresponding to the cache entry from the system memory DRAM.

6. The processor-based system of claim 4, wherein the DRAM cache management circuit is configured to write the ECC for the cache entry in the error protection region of the cache entry as a Reed-Solomon code;
the DRAM cache management circuit further configured to write an error code indicator in the error protection region of the cache entry, indicating whether the error protection region of the cache entry contains the EDC or the ECC for the cache entry.

7. The processor-based system of claim 1 integrated into an integrated circuit (IC).

8. The processor-based system of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

9. The processor-based system of claim 1, wherein the high-bandwidth memory comprises a die-stacked DRAM.

10. A processor-based system including a dynamic random access memory (DRAM) cache management circuit comprising:
a means for repurposing an error protection region of a cache entry of a plurality of cache entries of a DRAM cache that is part of a high-bandwidth memory to store a tag and an error detection code (EDC) instead of an error correcting code (ECC) for the cache entry;
a means for incorporating a tag storage region of the cache entry of the plurality of cache entries of the DRAM cache into a data storage region of the cache entry;
a means for writing data to be cached in the data storage region of the cache entry of the plurality of cache entries of the DRAM cache; and
a means for writing the tag and the EDC for the cache entry in the error protection region of the cache entry without writing an ECC in the error protection region of the cache entry.

11. The processor-based system of claim 10, wherein the high-bandwidth memory comprises a die-stacked DRAM.

12. A method for providing space-efficient storage of dynamic random access memory (DRAM) cache tags in a DRAM cache, comprising:
repurposing, by a DRAM cache management circuit, an error protection region of a cache entry of a plurality of cache entries of a DRAM cache that is part of a high-bandwidth memory to store a tag and an error detection code (EDC) instead of an error correcting code (ECC) for the cache entry;
incorporating, by a DRAM cache management circuit, a tag storage region of the cache entry of the plurality of cache entries of the DRAM cache into a data storage region of the cache entry;
writing, by the DRAM cache management circuit, data to be cached in the data storage region of the cache entry of the plurality of cache entries of the DRAM cache; and
writing the tag and the EDU for the cache entry in the error protection region of the cache entry without writing an ECC in the error protection region of the cache entry.

13. The method of claim 12, wherein the DRAM cache management circuit is configured to operate in a write-through mode.

14. The method of claim 13, further comprising:

reading the cache entry of the plurality of cache entries of the DRAM cache;

determining whether the EDC for the cache entry in the error protection region of the cache entry indicates a data error; and responsive to determining that the EDC for the cache entry in the error protection region of the cache entry indicates a data error, reading a memory line corresponding to the cache entry from a system memory DRAM.

15. The method of claim 12, wherein the DRAM cache management circuit is configured to operate in a write-back mode;

the method further comprising:

determining whether the data to be cached has been modified;

responsive to determining that the data to be cached has been modified:

writing the data to be cached in the data storage region of the cache entry of the plurality of cache entries of the DRAM cache;

writing the tag for the cache entry in a tag storage region of the cache entry;

writing an ECC for the cache entry in the error protection region of the cache entry; and setting a dirty indicator corresponding to the cache entry of a plurality of dirty indicators of the DRAM cache management circuit to indicate that the cache entry contains modified data; and responsive to determining that the data to be cached has not been modified:

setting the dirty indicator corresponding to the cache entry of the plurality of dirty indicators to indicate that the cache entry contains unmodified data;

wherein repurposing the error protection region of the cache entry of the plurality of cache entries of the DRAM cache to store the tag and the EDC instead of an ECC for the cache entry, incorporating the tag storage region of the cache entry of the plurality of cache entries of the DRAM cache into the data storage region of the cache entry, writing the data to be cached in the data storage region of the cache entry of the plurality of cache entries of the DRAM cache and writing the tag and the EDC for the cache entry in the error protection region of the cache entry is further responsive to determining that the data to be cached has not been modified.

16. The method of claim 15, further comprising:

reading the cache entry of the plurality of cache entries of the DRAM cache;

determining, based on the dirty indicator of the plurality of dirty indicators corresponding to the cache entry, whether the cache entry contains modified data;

responsive to determining that the cache entry contains modified data:

determining whether the ECC for the cache entry in the error protection region of the cache entry indicates a data error; and responsive to determining that the ECC for the cache entry in the error protection region of the cache entry indicates a data error:

determining whether the data error is correctable;

responsive to determining that the data error is correctable, correcting the data error based on the ECC; and responsive to determining that the data error is not correctable, reading a memory line corresponding to the cache entry from a system memory DRAM; and responsive to determining that the cache entry does not contain modified data:

determining whether the EDC for the cache entry in the error protection region of the cache entry indicates a data error; and responsive to determining that the EDC for the cache entry in the error protection region of the cache entry indicates a data error, reading the memory line corresponding to the cache entry from the system memory DRAM.

17. The method of claim 15, wherein writing the ECC for the cache entry in the error protection region of the cache entry comprises writing a Reed-Solomon code;

the method further comprising writing an error code indicator in the error protection region of the cache entry, indicating whether the error protection region of the cache entry contains the EDC or the ECC for the cache entry.

18. A non-transitory computer-readable medium having stored thereon computer executable instructions which, when executed by a processor, cause the processor to:

repurpose an error protection region of a cache entry of a plurality of cache entries of a dynamic random access memory (DRAM) cache that is part of a high-bandwidth memory to store a tag and an error detection code (EDC) instead of an error correcting code (ECC) for the cache entry;

incorporate a tag storage region of the cache entry of the plurality of cache entries of the DRAM cache into a data storage region of the cache entry;

write data to be cached in the data storage region of a the cache entry of the plurality of cache entries of the DRAM cache; and write the tag and the EDC for the cache entry in the error protection region of the cache entry without writing an ECC in the error protection region of the cache entry.

19. The non-transitory computer-readable medium of claim 18, having stored thereon computer executable instructions which, when executed by the processor, further cause the processor to:

read the cache entry of the plurality of cache entries of the DRAM cache;

determine whether the EDC for the cache entry in the error protection region of the cache entry indicates a data error; and responsive to determining that the EDC for the cache entry in the error protection region of the cache entry indicates a data error, read a memory line corresponding to the cache entry from a system memory DRAM.

20. The non-transitory computer-readable medium of claim 18, having stored thereon computer executable instructions which, when executed by the processor, further cause the processor to:

determine whether the data to be cached has been modified;

responsive to determining that the data to be cached has been modified:

write the data to be cached in the data storage region of the cache entry of the plurality of cache entries of the DRAM cache;

write the tag for the cache entry in a tag storage region of the cache entry;

write an ECC for the cache entry in the error protection region of the cache entry; and set a dirty indicator corresponding to the cache entry of a plurality of dirty indicators to indicate that the cache entry contains modified data; and responsive to determining that the data to be cached has not been modified:

set the dirty indicator corresponding to the cache entry of the plurality of dirty indicators to indicate that the cache entry contains unmodified data;

wherein repurposing the error protection region of the cache entry of the plurality of cache entries of the DRAM cache to store the tag and the EDC instead of an ECC for the cache entry, incorporating the tag storage region of the cache entry of the plurality of cache entries of the DRAM cache into the data storage region of the cache entry, writing the data to be cached in the data storage region of the cache entry of the plurality of cache entries of the DRAM cache and writing the tag and the EDC for the cache entry in the error protection region of the cache entry is further responsive to determining that the data to be cached has not been modified.

21. The non-transitory computer-readable medium of claim 20, having stored thereon computer executable instructions which, when executed by the processor, further cause the processor to:

read the cache entry of the plurality of cache entries of the DRAM cache;

determine, based on the dirty indicator of the plurality of dirty indicators corresponding to the cache entry, whether the cache entry contains modified data;

responsive to determining that the cache entry contains modified data:

determine whether the ECC for the cache entry in the error protection region of the cache entry indicates a data error; and responsive to determining that the ECC for the cache entry in the error protection region of the cache entry indicates a data error:

determine whether the data error is correctable;

responsive to determining that the data error is correctable, correct the data error based on the ECC; and responsive to determining that the data error is not correctable, read a memory line corresponding to the cache entry from a system memory DRAM; and responsive to determining that the cache entry does not contain modified data:

determine whether the EDC for the cache entry in the error protection region of the cache entry indicates a data error; and responsive to determining that the EDC for the cache entry in the error protection region of the cache entry indicates a data error, read the memory line corresponding to the cache entry from the system memory DRAM.

22. The non-transitory computer-readable medium of claim 20, having stored thereon computer executable instructions which, when executed by the processor, further cause the processor to:

write the ECC for the cache entry in the error protection region of the cache entry by writing a Reed-Solomon code; and write an error code indicator in the error protection region of the cache entry, indicating whether the error protection region of the cache entry contains the EDC or the ECC for the cache entry.

* * * * *